(12) United States Patent
Vesterinen et al.

(10) Patent No.: US 11,131,688 B2
(45) Date of Patent: Sep. 28, 2021

(54) ROBUST Z-AXIS ACCELERATION SENSOR

(71) Applicant: MURATA MANUFACTURING CO., LTD., Nagaokakyo (JP)

(72) Inventors: Hannu Vesterinen, Espoo (FI); Matti Liukku, Helsinki (FI); Ville-Pekka Rytkönen, Klaukkala (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/874,088

(22) Filed: May 14, 2020

(65) Prior Publication Data

US 2020/0363446 A1    Nov. 19, 2020

(30) Foreign Application Priority Data

May 15, 2019   (FI) ...................................... 20195402

(51) Int. Cl.
*G01P 15/18*   (2013.01)
*G01P 15/125*   (2006.01)

(52) U.S. Cl.
CPC ............ *G01P 15/125* (2013.01); *G01P 15/18* (2013.01); *B81B 2201/0235* (2013.01)

(58) Field of Classification Search
CPC . G01P 15/125; G01P 15/18; B81B 2201/0235
See application file for complete search history.

(56) References Cited

U.S. PATENT DOCUMENTS

| | | | |
|---|---|---|---|
| 9,581,614 B2* | 2/2017 | Kwa ..................... | B81B 3/0021 |
| 2006/0021436 A1 | 2/2006 | Kapser et al. | |
| 2006/0032310 A1* | 2/2006 | Merassi ................. | G01P 15/125 |
| | | | 73/514.35 |
| 2008/0282801 A1* | 11/2008 | Yin ...................... | G01P 15/0802 |
| | | | 73/514.01 |
| 2009/0071251 A1* | 3/2009 | Mochida ................. | G01P 15/18 |
| | | | 73/514.36 |
| 2009/0183570 A1* | 7/2009 | Acar ..................... | G01P 15/125 |
| | | | 73/514.32 |
| 2010/0122579 A1* | 5/2010 | Hsu ........................ | G01P 15/18 |
| | | | 73/514.32 |

(Continued)

FOREIGN PATENT DOCUMENTS

| | | |
|---|---|---|
| EP | 2 479 579 A1 | 7/2012 |
| WO | 2016207800 A1 | 12/2016 |

OTHER PUBLICATIONS

Finnish Search Report dated Dec. 3, 2019 corresponding to Finnish Patent Application No. 20195402.

(Continued)

*Primary Examiner* — David J Bolduc
(74) *Attorney, Agent, or Firm* — Squire Patton Boggs (US) LLP

(57) ABSTRACT

A capacitive micromechanical accelerometer comprising a first proof mass, a second proof mass, a third proof mass and a fourth proof mass. Each proof mass is configured as a seesaw which undergoes rotation out of the xy-plane in response to z-axis acceleration. The four proof masses are suspended from the same central anchor point with torsionally flexible suspension arrangements. Errors introduced into the output signal by wafer bending can be automatically compensated in a differential capacitive measurement.

5 Claims, 7 Drawing Sheets

(56) References Cited

U.S. PATENT DOCUMENTS

| | | | |
|---|---|---|---|
| 2011/0113880 A1* | 5/2011 | Schmid | G01P 15/131 |
| | | | 73/514.01 |
| 2011/0234206 A1 | 9/2011 | Kawakubo et al. | |
| 2012/0132003 A1 | 5/2012 | Comi et al. | |
| 2012/0186347 A1* | 7/2012 | McNeil | G01P 15/125 |
| | | | 73/514.32 |
| 2013/0192362 A1* | 8/2013 | Rytkonen | G01P 15/08 |
| | | | 73/504.08 |
| 2013/0192371 A1* | 8/2013 | Rytkonen | G01P 15/18 |
| | | | 73/514.32 |
| 2014/0060184 A1 | 3/2014 | Walther | |
| 2014/0137670 A1 | 5/2014 | Hata et al. | |
| 2014/0251011 A1* | 9/2014 | Zhang | G01P 15/08 |
| | | | 73/514.32 |
| 2015/0192603 A1* | 7/2015 | Baldasarre | G01P 15/125 |
| | | | 73/514.32 |
| 2016/0356806 A1* | 12/2016 | Malvern | G01P 15/125 |
| 2016/0377648 A1 | 12/2016 | Zhang | |
| 2016/0377649 A1* | 12/2016 | Rytkonen | G01P 15/18 |
| | | | 73/514.32 |
| 2017/0089945 A1* | 3/2017 | Naumann | G01P 15/125 |
| 2018/0031601 A1* | 2/2018 | Anac | G01C 19/5726 |
| 2018/0106829 A1 | 4/2018 | Koster et al. | |
| 2018/0216936 A1* | 8/2018 | Ayazi | G01C 19/5747 |
| 2018/0238927 A1* | 8/2018 | Castro | B81B 3/0078 |
| 2018/0275161 A1* | 9/2018 | Tang | G01P 15/125 |
| 2019/0041422 A1* | 2/2019 | Malvern | G01P 15/131 |
| 2019/0100426 A1* | 4/2019 | Painter | B81B 3/0097 |
| 2019/0162747 A1* | 5/2019 | Thompson | B81B 5/00 |
| 2019/0187169 A1* | 6/2019 | Tang | G01C 19/5755 |
| 2020/0018777 A1* | 1/2020 | Liukku | G01P 15/125 |
| 2020/0096538 A1* | 3/2020 | Zhang | G01P 15/0802 |
| 2021/0072280 A1* | 3/2021 | Liukku | G01P 15/125 |

OTHER PUBLICATIONS

Sep. 21, 2020 Search Report issued in European Patent Application No. 20170531.

* cited by examiner

ROBUST Z-AXIS ACCELERATION SENSOR

FIELD OF THE DISCLOSURE

The present disclosure relates to microelectromechanical (MEMS) acceleration sensors, and more particularly to acceleration sensors which measure acceleration at least in a direction which is perpendicular to the substrate plane. Such sensors may be combined with other sensors which measure acceleration in the substrate plane to form a three-axis accelerometer. Three-axis accelerometers may be used in automotive applications, such as Electronic Stability Control (ESP/ESC), Antilock Braking (ABS), Electric Parking Brake (EPB), Hill Start Assistance (HSA), Electronically Controlled Suspension (ECS), headlight levelling or airbag deployment.

BACKGROUND OF THE DISCLOSURE

A MEMS accelerometer typically comprises a device wafer where the micromechanical structures are formed by etching. The device wafer defines a device plane. In this disclosure, the device plane will be illustrated as the xy-plane.

The device wafer is thin, so it may be supported by a handle wafer during the manufacturing process. The handle wafer may also form a part of the finished accelerometer component. Alternatively, the device wafer may be transferred from the handle wafer to a packaging wafer, which supports the device wafer in the finished device. In either case, the micromechanical structures in the device wafer may be enclosed in a fixed enclosure where the handle wafer or packaging wafer forms an enclosure wall on one side of the device wafer, and a capping wafer forms an enclosure wall on the opposite side of the device wafer.

FIG. 1a illustrates schematically a MEMS accelerometer which comprises a device wafer 11 which is fixed to a handle wafer 16 (which may also be a packaging wafer). The device wafer comprises a partly mobile device structure 111, which in this case is a seesaw which rotates about a y-axis which is perpendicular to the xz-plane shown in the figure. The partly mobile device structure may also be called a rotor. The MEMS accelerometer further comprises a capping wafer 17. The capping wafer and/or the handle wafer are shaped so that they together form an enclosed space 12 where the partly mobile device structure 111 can move. The handle wafer forms a first fixed enclosure wall 161 and the capping wafer forms a second fixed enclosure wall 171. An anchor 14 extends from the first fixed enclosure wall 161 to the device wafer 11 and supports its weight.

MEMS accelerometers may comprise capacitors for detecting the movement of partly mobile device structures. These capacitors typically comprise capacitor electrodes connected to electrical wires. Electrodes placed on the partly mobile device structures may be called rotor electrodes, while fixed electrodes, which may be placed either on the fixed parts of the device wafer or on the enclosure walls, may be called stator electrodes. Stator and rotor electrodes may comprise a metallic electrode plate, such as plates 131 and 132 illustrated in FIG. 1a. Alternatively, if the device wafer is a silicon substrate with sufficient conductivity, stator and rotor electrodes may be formed directly in the silicon substrate by connecting electrical wires to certain areas of the wafer.

A control unit may be configured to read an output signal from the accelerometer by sampling one or more capacitances. It is often advantageous to sample a differential capacitance if possible. Differential capacitance measurements are less noisy than single-sided measurements because they allow the acceleration signal to be more clearly separated from disturbing capacitive signals which may arise from vibrations, or from acceleration in other directions than the measured direction. In FIG. 1a, a differential capacitance measurement can for example be conducted by subtracting a capacitance measured between stator electrode 131 and a rotor electrode on the right side of the rotor 111 from a capacitance measured between stator electrode 132 and a rotor electrode on the left side of the rotor 111.

However, erroneous differential measurement signals can arise if the alignment between the device wafer 11 and the handle wafer 16 changes due to mechanical, thermal, or other forms of stress so that the device wafer and the handle wafer are no longer parallel. The handle wafer may for example be bent during manufacturing, or the supports which fix the device wafer to the handle wafer may undergo changes which tilt the device wafer 11 in relation to the enclosure walls, as illustrated in FIG. 1b. Such structural changes may involve a multitude of different stress-related changes, but in this disclosure they will for simplicity all be referred to as "wafer bending".

Wafer bending can cause offset errors in differential capacitance measurements. As seen in FIG. 1b, bending of the anchor 14 and the device wafer 11 brings the right side of the partly mobile device structure 111 closer to the stator electrode 131 than it would have been without bending, while the left side of the partly mobile device structure 111 moves further away from the stator electrode 132 than it would have been if no bending had occurred. A systematic offset error is thereby introduced to a differential output signal measured from these electrodes.

Document US2016377648 discloses a z-axis accelerometer with a measurement system designed to compensate offset errors from wafer bending by introducing an additional platform-sensing electrode. However, this complicates the measurement and requires additional wiring. Document EP2479579 discloses a z-axis accelerometer with two seesaws that rotate about a common axis.

BRIEF DESCRIPTION OF THE DISCLOSURE

An object of the present disclosure is to provide an apparatus which alleviates the above disadvantages.

The object of the disclosure is achieved by an arrangement which is characterized by what is stated in the independent claims. The preferred embodiments of the disclosure are disclosed in the dependent claims.

The disclosure is based on the idea of providing an accelerometer where two pairs of z-axis seesaws are suspended from on opposite sides of the same central anchor point. An advantage of this arrangement is that, by summing the capacitances of the one or more seesaw pairs to a differential output signal, the offset induced by wafer bending in the output signal can be reduced.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1A:
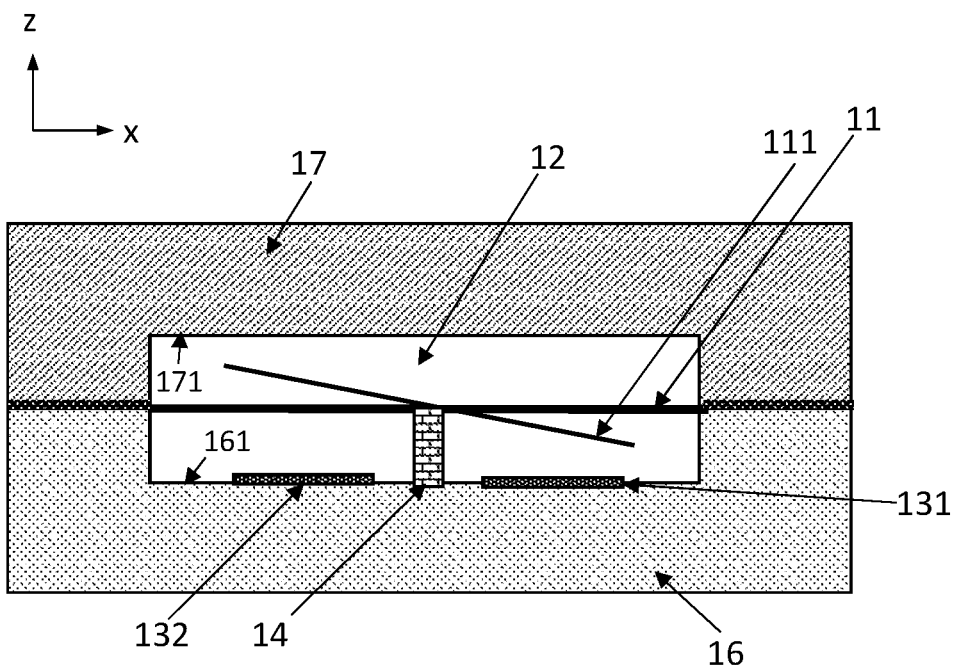
FIGS. 1a-1b illustrate wafer bending.

This disclosure describes a capacitive micromechanical accelerometer comprising a first proof mass, a second proof mass, a third proof mass and a fourth proof mass in a device plane. The accelerometer further comprises a central anchor point in the device plane. A lateral axis and a transversal axis lie within the device plane and cross each other orthogonally at the central anchor point.

The first proof mass is located on a first side of the transversal axis, and the first proof mass crosses the lateral axis. The center of gravity of the first proof mass lies at a nonzero first transversal distance from the lateral axis. The first proof mass is suspended from the central anchor point by a first lateral, torsionally flexible suspension arrangement which extends along the lateral axis from the central anchor point to the first proof mass.

The second proof mass is located on a second side of the transversal axis, and the second proof mass crosses the lateral axis. The second side of the transversal axis is opposite to the first side of the transversal axis. The center of gravity of the second proof mass lies at a nonzero second transversal distance from the lateral axis. The second proof mass is suspended from the central anchor point by a second lateral, torsionally flexible suspension arrangement which extends along the lateral axis from the central anchor point to the second proof mass.

The accelerometer further comprises at least one first rotor sensing electrode on each of the first and second proof masses on a first side of the lateral axis, and at least one second rotor sensing electrode on each of the first and second proof masses on a second side of the lateral axis. The second side of the lateral axis is opposite to the first side of the lateral axis.

The third proof mass is located on the first side of the lateral axis, and the third proof mass crosses the transversal axis. The center of gravity of the third proof mass lies at a nonzero first lateral distance from the transversal axis. The third proof mass is suspended from the central anchor point by a first transversal, torsionally flexible suspension arrangement which extends along the transversal axis from the central anchor point to the third proof mass.

The fourth proof mass is located on the second side of the lateral axis, and the fourth proof mass crosses the transversal axis. The center of gravity of the fourth proof mass lies at a nonzero second lateral distance from the transversal axis. The fourth proof mass is suspended from the central anchor point by a second transversal, torsionally flexible suspension arrangement which extends along the transversal axis from the central anchor point to the fourth proof mass.

The accelerometer further comprises at least one first rotor sensing electrode on each of the third and fourth masses on the first side of the transversal axis, and at least one second rotor sensing electrode on each of the third and fourth proof masses on the second side of the transversal axis.

The accelerometer also comprises at least one fixed stator sensing electrode adjacent to each first rotor sensing electrode and at least one fixed stator sensing electrode adjacent to each second rotor sensing electrode.

Each torsionally flexible suspension arrangement comprises a stiff beam and a first torsion spring connected in series, so that one end of the stiff beam is attached to the central anchor point and the other end to the first torsion spring, and one end of the first torsion spring is attached to the stiff beam and the other to the corresponding proof mass.

In this disclosure the device plane is illustrated and referred to as the xy-plane. The vertical z-axis is perpendicular to the xy-plane. Rotational motion where the center of gravity of a proof mass moves in a vertical direction may be referred to as "out-of-plane" motion, or "motion out of the device plane".

The lateral axis is parallel to the illustrated x-axis, and the transversal axis is parallel to the illustrated y-axis. The transversal axis crosses the lateral axis at the central anchor point, dividing the lateral axis into a first side and a second side which are opposite to each other. Conversely, the lateral axis crosses the transversal axis at the central anchor point, dividing the transversal axis into a first side and a second side which are opposite to each other.

In this disclosure the term "device wafer" refers to the body from which the micromechanical structures which form the partly mobile parts (such as proof masses and flexible suspenders) of the accelerometer have been prepared. When the structures are completed, the other parts of the device wafer form a supporting body which may surround the partly mobile parts in the device plane. The device wafer may, for example, be a silicon wafer. The partly mobile parts may be manufactured from the device wafer by etching the wafer. In this disclosure the term "device wafer" refers to a thin substrate which forms the structure layer from which the microelectromechanical structures are manufactured. As mentioned above, the device wafer substrate typically requires structural support from a separate, much thicker handle wafer or support wafer.

Each of the first, second, third and fourth proof masses forms a seesaw, which may also be called a teeter-totter. Each seesaw responds to acceleration in the direction of the z-axis with out-of-plane rotation. If the seesaws are not coupled to each other, the response of each seesaw is independent of the response of the others. The accelerometer can be made more robust by coupling two or more seesaws to each other mechanically, so that they move in unison in response to acceleration along the z-axis.

Each proof mass is suspended from a suspension arrangement which extends along one axis (either the lateral axis or the transversal axis), and proof mass each has a center of gravity which does not lie on that axis. The suspension arrangement is prepared from the device wafer. The suspension arrangement can for example be configured to allow torsional twisting about the axis on which it is extended. By dimensioning the suspension arrangement suitably, it can be configured to allow a predefined amount of out-of-plane rotation in the attached proof mass in response to z-axis acceleration of a certain magnitude. The first, second, third and fourth proof masses will then tilt out of the device plane when the accelerometer undergoes acceleration in the vertical direction. The torsional stiffness of the suspension arrangements can be selected so that suitable tilt angles are obtained in the range of z-axis acceleration values where the sensor is expected to operate.

The tilt angle of a proof mass can be measured capacitively with sensing electrodes. The sensing electrodes comprise a set of rotor electrodes attached to each proof mass, and a corresponding set of stator electrodes attached either to a fixed portion of the device wafer, or to a fixed enclosure which surrounds the accelerometer. In this context, the term "rotor" refers to a partly mobile structure, while the term "stator" refers to a fixed structure. Together, a rotor electrode and an adjacent stator electrode form a sensing capacitor. Capacitive measurements can be conducted between the rotor and stator electrodes to determine the tilt angle. The magnitude of the acceleration in the direction of the z-axis can be calculated from the tilt angle. Successive measurements may be combined into an output signal with a signal amplitude which is proportional to this acceleration.

Proof Mass Placement

Figure 2A:
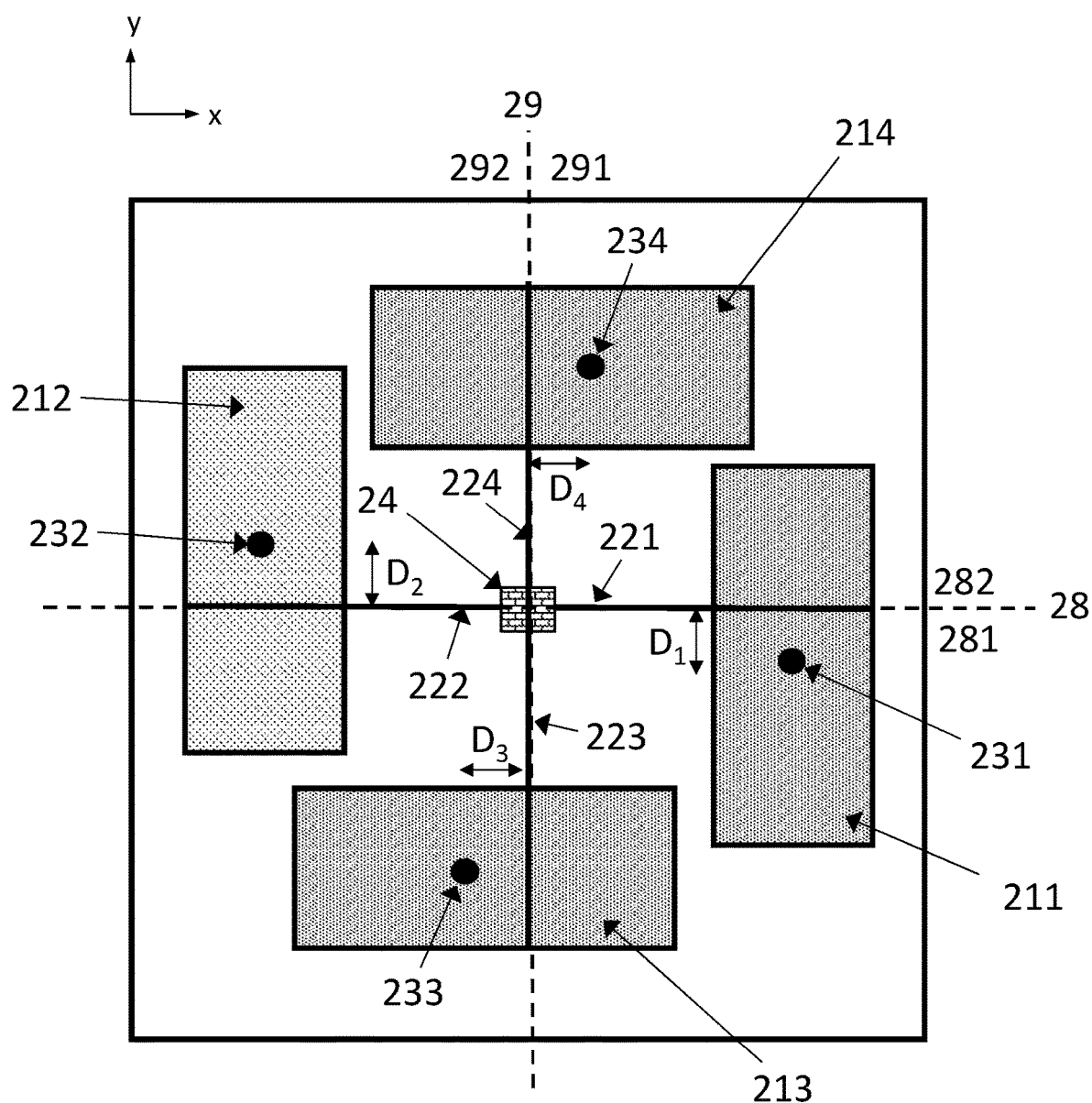
FIG. 2a illustrates an accelerometer with four proof masses.

FIG. 2a illustrates an accelerometer with a first proof mass 211, second proof mass 212, third proof mass 213 and fourth proof mass 214. Each of these four proof masses is suspended from the same central anchor point 24. The lateral axis is marked 28 and the transversal axis is marked 29. The first side of the lateral axis is 281 and the second side is 282, while the first side of the transversal axis is 291 and the second is 292. The center of gravity of the first proof mass 211 has been illustrated with the dot 231. The first transversal distance is indicated with $D_1$. The centers of gravity of the other three proof masses are correspondingly indicated with reference numbers 232-234, the second transversal distance is $D_2$ and the first and second lateral distances are $D_3$ and $D_4$, respectively.

In the illustrated embodiment, the first, second, third and fourth proof masses 211-214 all have the same shape in the device plane. The center of gravity 231 of the first proof mass 211 lies on the first side 281 of the lateral axis 28, the center of gravity 232 of the second proof mass 212 lies on the second side 282 of the lateral axis 28, the center of gravity 233 of the third proof mass 213 lies on the second side 292 of the transversal axis 29, and the center of gravity 234 of the fourth proof mass 214 lies on the first side 291 of the transversal axis 29. The first transversal distance, second transversal distance, first lateral distance and second lateral distance are all equal.

221 is the first lateral suspension arrangement and 222 is the second lateral suspension arrangement. 223 is the first transversal suspension arrangement and 224 is the second transversal suspension arrangement. Throughout this disclosure, the lengths of these suspension arrangements are illustrated as equal. This is an optional feature, not a necessary requirement. It may in some cases be preferable to make their lengths unequal while still maintaining an equal torsional flexibility in all four suspension arrangements. Due to the torsional flexibility of the suspension arrangements, each proof mass may rotate as a seesaw about the corresponding rotation axis in response to an acceleration component which is perpendicular to the device plane.

Sensing capacitors are used to measure the seesaw movement of each proof mass capacitively. The movement of each proof mass may be sensed in a differential manner by at least two electrode pairs placed on opposite sides of its rotation axis (i.e. either the lateral or the transversal axis). An electrode pair comprises a rotor sensing electrode on the mobile proof mass and a stator sensing electrode on a fixed structure, as described above.

Rotor and stator sensing electrodes may comprise an area of conductive material deposited on the proof mass and the fixed structure, respectively. Alternatively, if the proof mass or fixed structure is made of a moderately conducting material such as silicon, the sensing electrodes may be formed by wiring a given region of the proof mass/fixed structure for electrical measurement.

Figure 1B:
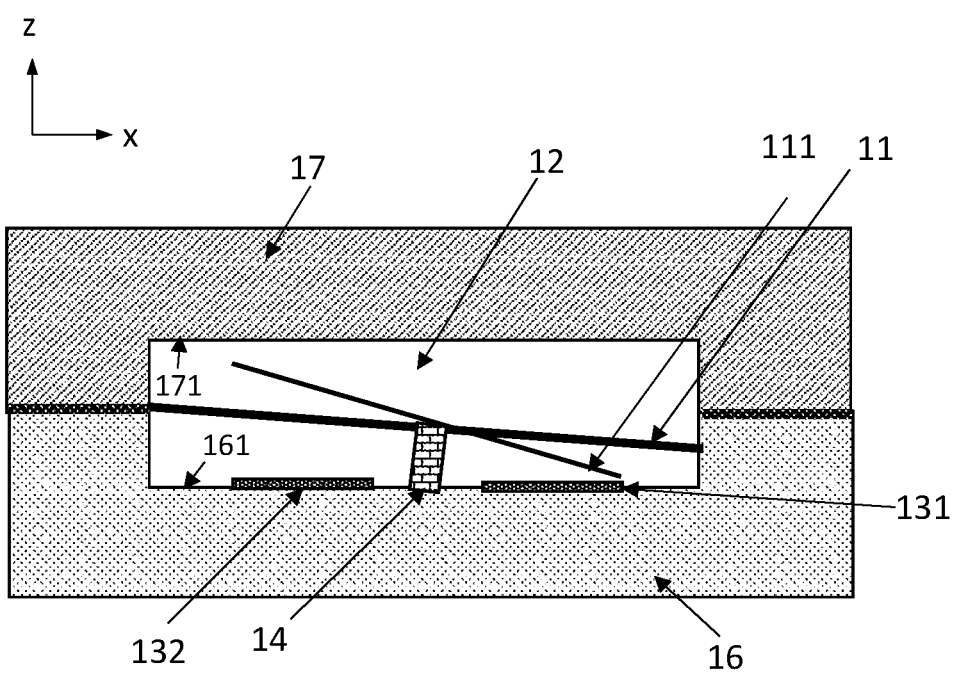

The fixed structure where stator sensing electrodes are prepared may be the walls of the enclosure which surrounds the device wafer, as in FIGS. 1a and 1b. Alternatively, stator sensing electrodes may be prepared in the device wafer itself. Only the first of these options will be discussed in detail below.

Figure 2B:
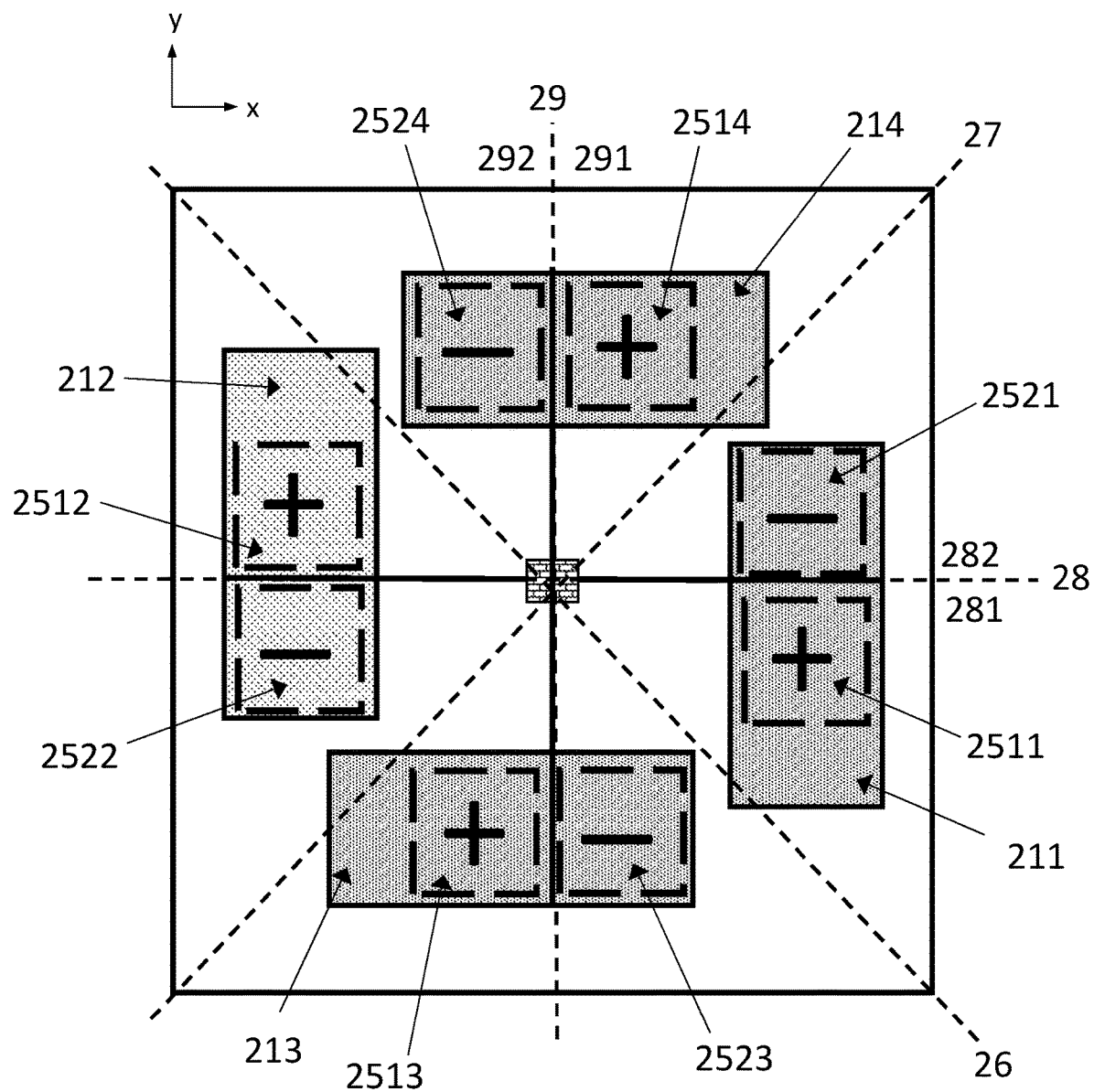
FIG. 2b illustrates sensing capacitors in the same accelerometer.

At least one fixed stator sensing electrode is vertically adjacent to each of the at least one first rotor sensing electrodes and the at least one second rotor sensing electrodes. The area of the stator sensing electrodes may be larger or smaller than the area of the first and second rotor sensing electrodes. FIG. 2b illustrates the placement of these electrode pairs in the accelerometer. The first overlap areas 2511, 2512, 2513, 2514 of each first rotor sensing electrode and the corresponding fixed stator sensing electrode is illustrated on the proof masses. Similarly, the second overlap areas 2521, 2522, 2523, 2524 of each second rotor sensing electrode and the corresponding fixed stator sensing electrode is illustrated on the proof masses. In other words, first sensing capacitors are formed in the first overlap areas 2511-2514, and second sensing capacitors are formed in the second overlap areas 2521-2524.

The plus and minus signs illustrate the differential measurement principle. A differential output signal proportional to acceleration in the z-direction may for example be obtained by summing the capacitances measured from all first sensing capacitors (the electrode pairs in the first overlap areas) and subtracting from this sum the sum of all capacitances measured from all second sensing capacitors (the electrode pairs in the second overlap areas). This may be written as S=2511+2512+2513+2514−2521−2522−2523−2524, where S is the output signal.

The illustrated accelerometer is robust against wafer bending for the following reasons. In simplified form, wafer bending may be imagined as a process where the device wafer bends for example around a transversal bending axis without incurring any bending about a lateral axis, or vice versa. A similar effect will occur if the anchor point in the middle tilts in a lateral direction in relation to the support wafer, without tilting in a transversal direction. In these cases, the distance from the first proof mass 211 to its vertically adjacent fixed stator electrodes may for example become larger than it was before the wafer bending took place, which introduces a systematic error (which may be called an offset) to the differential output 2511-2521 of its sensing capacitors.

In most cases, a bent wafer can, within the boundaries of a small accelerometer component, effectively be considered to be a tilted plane. The bending radius is typically much larger than the lateral or transversal dimensions of the accelerometer, so even a bent wafer is approximately planar within those dimensions.

If the bending can be approximated as a planar tilt within the boundaries of the accelerometer, then the distance from the second proof mass 212 to its vertically adjacent stator electrodes will decrease by approximately the same amount as the distance to the first proof mass 211 increased when the wafer bends.

This decrease in distance from the second seesaw B512 to its vertically adjacent stator electrodes introduces a systematic error to the differential output 2512-2522 as well. However, due to the symmetry of the capacitive electrodes with regard to the lateral and/or transversal axis, the output signal of the accelerometer may remain substantially unaffected by the wafer bending because an increase (or decrease) in the differential capacitance value 2511-2521 is compensated by a corresponding increase (decrease) in the differential capacitance value 2512-2522, so that no erroneous offset remains in the combined output signal.

Furthermore, the same bending compensating takes place in the capacitive measurements performed on the third and fourth proof masses 213 and 214 if the bending axis is lateral, because this displaces these proof masses in opposite vertical directions. The sum of differential capacitances 2513+2514−2523−2524 will again remain approximately constant, at least if the bending radius is much larger than the dimensions of the accelerometer.

There may not in practice be any reason why wafer bending would occur around only one bending axis, and even when it does, there may be no reason why that axis would be precisely transversal or lateral. A bending axis may be oriented in any direction in the device plane, and wafer bending may in practice exhibit the three-dimensional geometry of a bubble, where no single bending axis can be identified in the device plane. Bending compensation may not work perfectly if wafer bending occurs in these non-ideal forms. Nevertheless, with the arrangement described above, the offset that more complicated wafer bending produces in the output signal will still be at least partly compensated in the output signal if the bending occurs at least partly along the transversal and/or the lateral axis.

As illustrated in FIG. 2b, the first overlap area 2511 on the first proof mass 211 may be reflectionally symmetric with the second overlap area 2521 on the first proof mass 211 with respect to the lateral axis 28. The area 2511 may also be reflectionally symmetric with the second overlap area 2522 on the second proof mass 212 with respect to the transversal axis 29, reflectionally symmetric with the second overlap area 2523 on the third proof mass 213 with respect to a first diagonal axis 26 and reflectionally symmetric with the second overlap area 2524 on the fourth proof mass 214 with respect to a second diagonal axis 27. The first overlap areas 2512-2514 on the second, third and fourth proof mass may exhibit a similar fourfold reflectional symmetry with the second overlap areas 2521-2524. The second overlap areas 2521-2524 then also exhibit a similar fourfold reflectional symmetry with respect to each of the first overlap areas 2511-2514. This symmetry facilitates bending compensation even when the bending axis is diagonal.

Figure 3A:
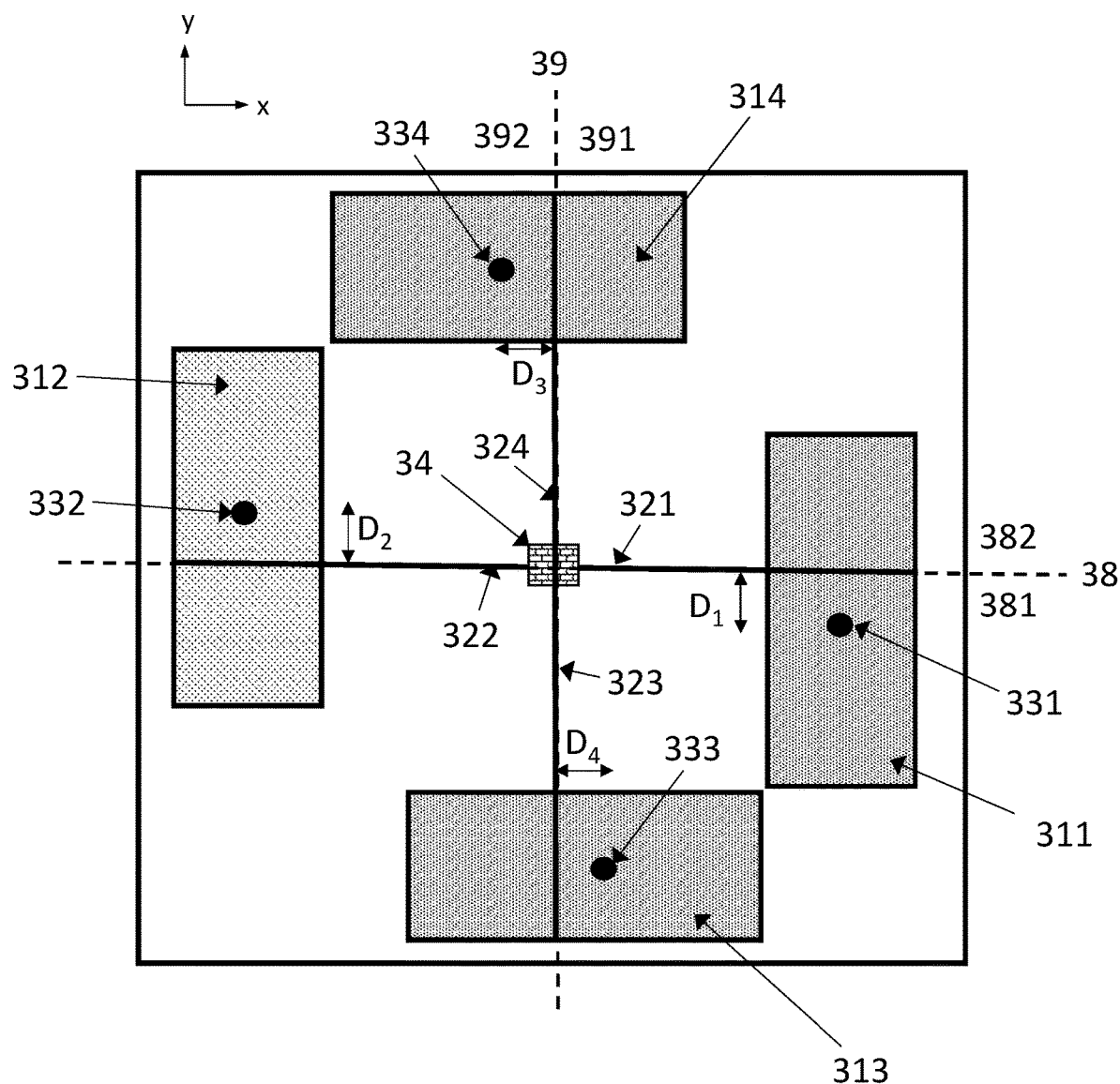
FIG. 3a also illustrates an accelerometer with four proof masses.

FIG. 3a illustrates an alternative embodiment where reference numbers 311-314, 321-324, 331-334, 34, 38 and 39 correspond to reference numbers 211-214, 221-224, 231-234, 24, 28 and 29 in FIG. 2a. The proof masses 311-314 all have the same shape in the device plane. The first and second proof masses 311 and 312 are lined up in the same manner as in FIG. 2a, but the third and fourth proof masses 313-314 are oriented in the opposite direction.

In other words, the center of gravity 331 of the first proof mass 311 lies on the first side 381 of the lateral axis 38, and the center of gravity 332 of the second proof mass 312 lies on the second side 382 of the lateral axis 38, as before. However, the center of gravity 333 of the third proof mass 313 now lies on the first side 391 of the transversal axis 39, and the center of gravity 334 of the fourth proof mass 314 instead lies on the second side 392 of the transversal axis 39. The first transversal distance, second transversal distance, first lateral distance and second transversal distance are again all equal.

Figure 3B:
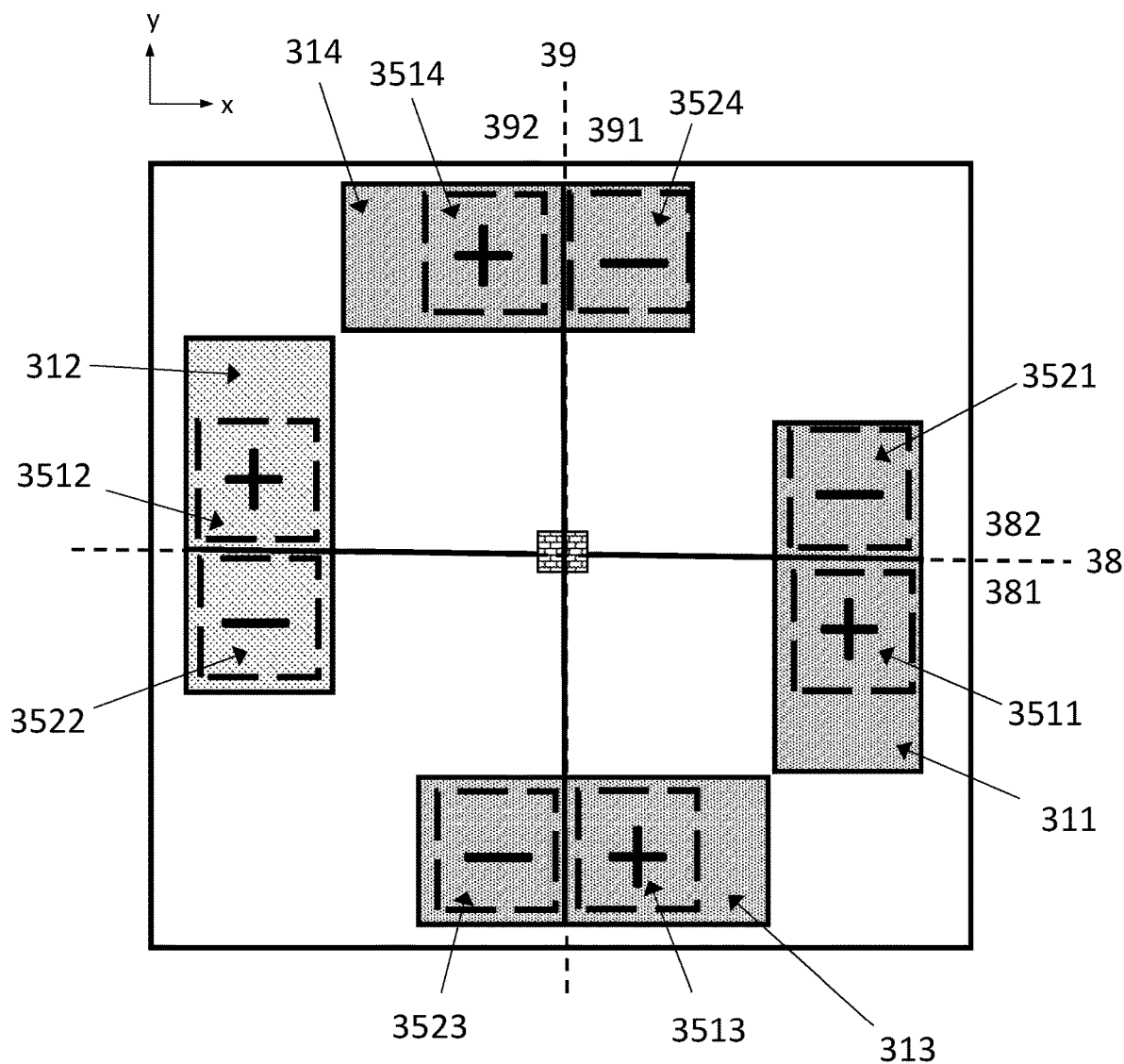
FIG. 3b illustrates sensing capacitors in the same accelerometer.

FIG. 3b illustrates the placement of sensing electrodes in the embodiment of FIG. 3a. Reference numbers 3511-3514 and 3521-3524 correspond to reference numbers 2511-2514 and 2521-2524, respectively, in FIG. 2b. A differential output signal can be summed from the output signals of these sensing capacitors in the same manner as in the previous example. The effect of wafer bending can be compensated in this output signal if the bending axis is lateral or transversal, but not if it is diagonal because the sensing capacitors lack symmetry with respect to the diagonal axes.

Coupling Between Proof Masses

As mentioned above, the proof masses may be coupled to each other so that they form interconnected seesaws. If the coupling between the masses is sufficiently rigid in the vertical direction, they will be forced to undergo out-of-plane rotation simultaneously when the accelerometer experiences acceleration along the z-axis. This reduces the risk of measurement errors due to structural differences between the proof masses and/or between their suspensions. Such differences can sometimes be introduced by small discrepancies in the manufacturing process.

Figure 4A:
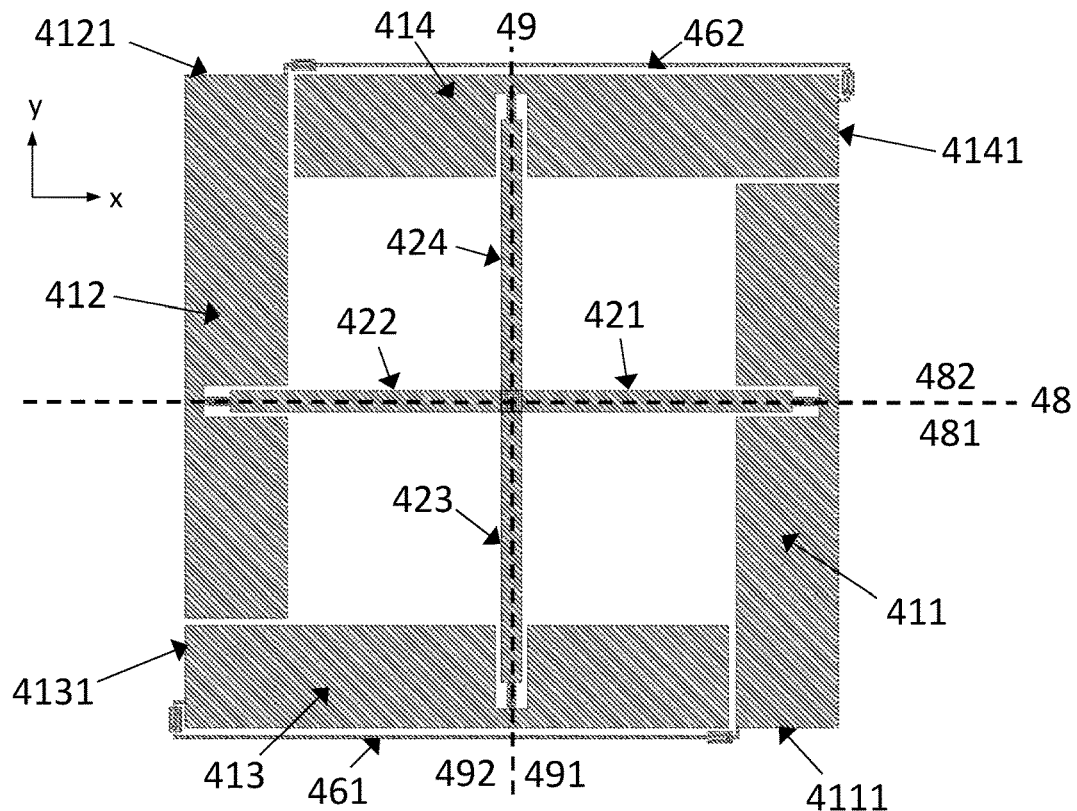
FIGS. 4a-4b illustrate coupling arrangements.

FIG. 4a illustrates a first coupling embodiment. Reference numbers 411-414, 421-424, 48, 481-482, 49 and 491-492 correspond to reference numbers 211-214 and 221-224, 28, 281-282, 29 and 291-292 respectively, in FIG. 2a. A first end 4111 of the first proof mass 411 lies on the first side 481 of the lateral axis 48, and this first end 4111 of the first proof mass 411 is coupled with a first vertically rigid coupling element 461 to a first end 4131 of the third proof mass 413. The first end 4131 lies on the second side 492 of the transversal axis 49. A first end 4121 of the second proof mass 412 lies on the second side 482 of the lateral axis 48. This first end 4121 of the second proof mass 412 is coupled with a second vertically rigid coupling element 462 to a first end 4141 of the fourth proof mass 414. The first end 4141 lies on the first side 491 of the transversal axis 49.

The first and second coupling elements 461 and 462 may be of any shape which is suitable for the desired coupling arrangement. They may be thick in the z-direction to ensure sufficient vertical rigidity. They may be attached to each proof mass with an attachment part which has some torsional flexibility, since out-of-plane rotation of the proof masses may impart twisting forces on the coupling elements.

Figure 4B:
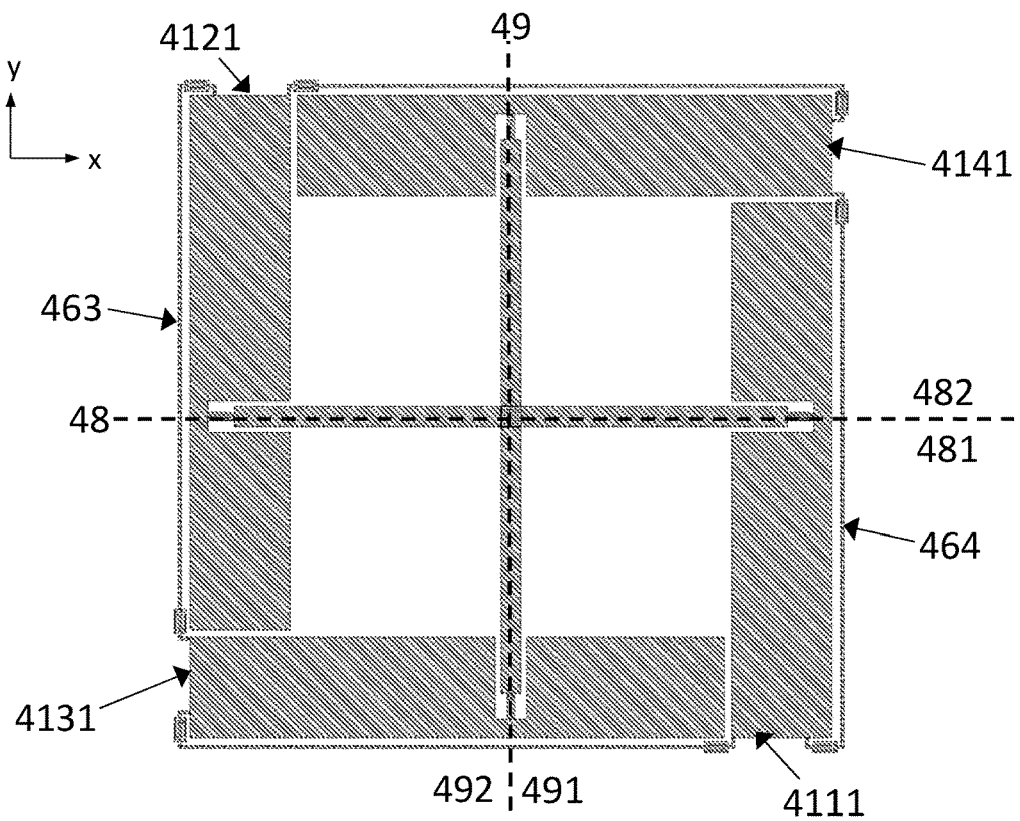

FIG. 4b illustrates a second coupling embodiment where, in addition to the coupling already illustrated in FIG. 4a, the first end 4131 of the third proof mass is coupled to the first end 4121 of the second proof mass with a third vertically rigid coupling element 463, and the first end 4141 of the fourth proof mass is coupled to the first end 4111 of the first proof mass with a fourth vertically rigid coupling element 464.

It is also possible to couple the second ends of adjacent proof masses to each other, wherein the second end of each proof mass is opposite to its first end.

Suspension Arrangements

Figure 5A:
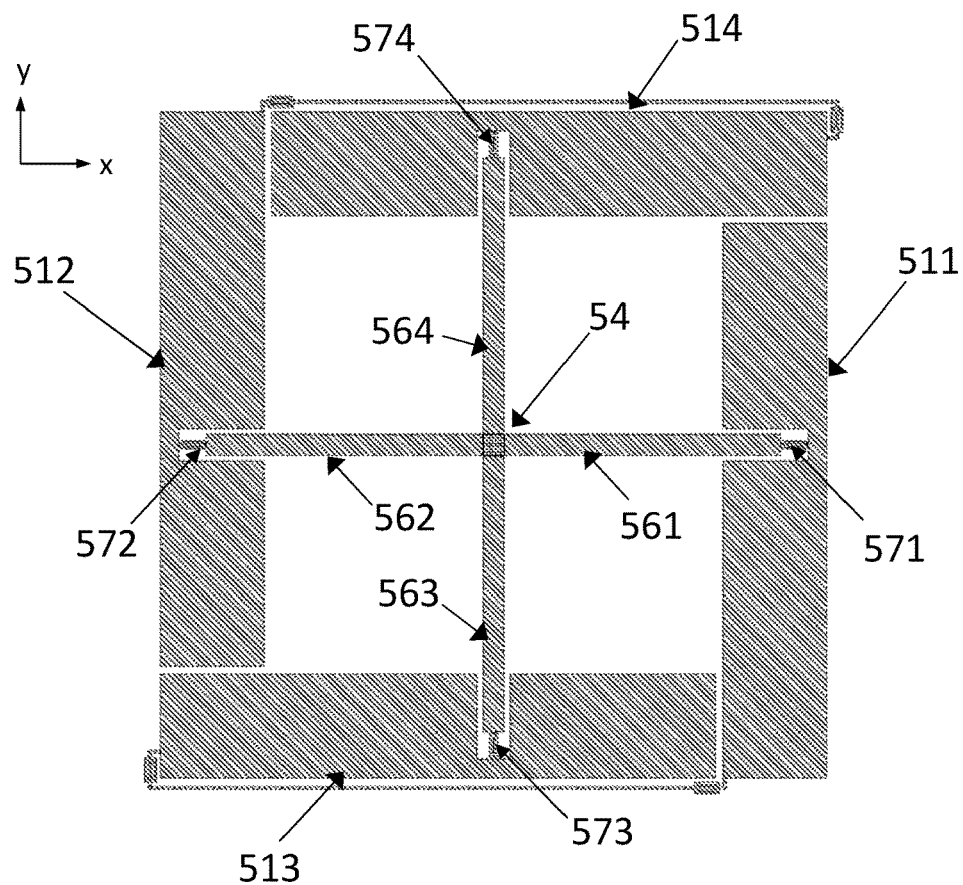
FIGS. 5a-5b illustrate suspension arrangements.

FIG. 5a illustrates a first suspension embodiment. Reference numbers 511-514 and 54 correspond to reference number 211-214 and 24, respectively, in FIG. 2a. Reference numbers 561 and 571 together correspond to reference number 221 in FIG. 2a. Similarly, reference numbers 562+572, 563+573 and 564+574 correspond to reference numbers, 222, 223 and 224, respectively, in FIG. 2a. In other words, whereas the torsionally flexible suspension arrangements were indicated with a single reference number in FIG. 2a, in FIG. 5a the torsionally flexible suspension arrangement comprises a stiff beam (561-564) and a first torsion spring (571-574) connected in series. One end of the stiff beam (561-564) is attached to the central anchor point (54) and the other end to the first torsion spring (571-574). One end of the first torsion spring (571-574) is attached to the stiff beam (561-564) and the other to the corresponding proof mass (511-514). The stiff beams 561-564 may be called the first, second, third and fourth stiff beams, respectively.

The suspension arrangement illustrated in FIG. 5a may be vulnerable to external disturbances if the dimensions of the first torsion springs 571-574 are such that the torsion springs can bend lengthwise. If the accelerometer undergoes external vibration, the proof masses 511-514 may then oscillate (clockwise/counter-clockwise) in the xy-plane, around the tips of the stiff beams 561-564. The sensitivity of the accelerometer to such oscillation will depend on the dimensions of the proof masses and on how much angular deflection a given level of z-axis acceleration should produce (i.e. on the torsional spring constant required from the first torsion springs 571-574).

Figure 5B:
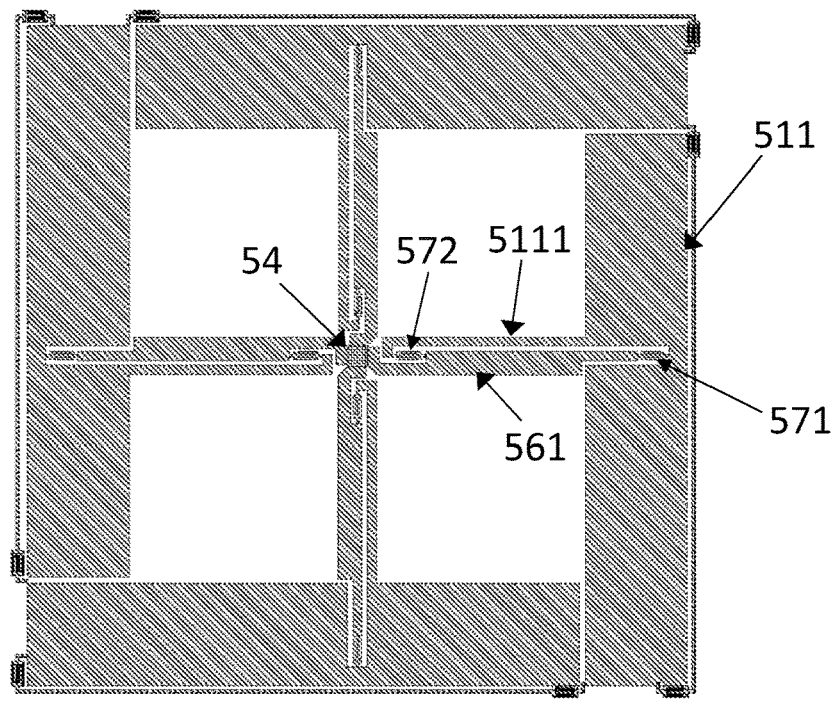

FIG. 5b illustrates an alternative suspension arrangement which is less vulnerable to undesired clockwise or counter-clockwise movements in the proof masses. Reference numbers have been added only to the suspension arrangement of the first proof mass 511 to preserve clarity, but the other three proof masses are also suspended with the same arrangement. The first, second, third and fourth proof masses each comprise a protrusion 5111 which extends parallel to the fixed beam 561 of the corresponding torsionally flexible suspension arrangement. Each torsionally flexible suspension arrangement further comprises a second torsion spring 572. One end of the second torsion spring 572 is attached to the fixed beam 561 and the other to said protrusion 5111.

The suspension arrangement illustrated in FIG. 5b can resist the clockwise/counter-clockwise rotation of the proof mass in the xy-plane with a far greater torque than the single torsion springs illustrated in FIG. 5a. The protrusions 5111 from each proof mass may extend almost to the central anchor point 54, as FIG. 5b illustrates. The second torsion springs 572 can then be attached almost to the anchored end of the fixed beams 561. Alternatively, the protrusions 5111 may be shorter than the fixed beams 561, and the second torsion springs 572 may be attached closer to the middle of the fixed beams 561.

The invention claimed is:

1. A capacitive micromechanical accelerometer comprising a first proof mass, a second proof mass, a third proof mass and a fourth proof mass in a device plane, and the accelerometer further comprises a central anchor point in the device plane, and a lateral axis and a transversal axis lie within the device plane and cross each other orthogonally at the central anchor point, wherein the first proof mass is located on a first side of the transversal axis, and the first proof mass crosses the lateral axis, and the center of gravity of the first proof mass lies at a nonzero first transversal distance from the lateral axis, and the first proof mass is suspended from the central anchor point by a first lateral, torsionally flexible suspension arrangement which extends along the lateral axis from the central anchor point to the first proof mass, and the second proof mass is located on a second side of the transversal axis, and the second side of the transversal axis is opposite to the first side of the transversal axis, and the second proof mass crosses the lateral axis, and the center of gravity of the second proof mass lies at a nonzero second transversal distance from the lateral axis, and the second proof mass is suspended from the central anchor point by a second lateral, torsionally flexible suspension arrangement which extends along the lateral axis from the central anchor point to the second proof mass, and the accelerometer further comprises at least one first rotor sensing electrode on each of the first and second proof masses on a first side of the lateral axis, and at least one second rotor sensing electrode on each of the first and second proof masses on a second side of the lateral axis, and the second side of the lateral axis is opposite to the first side of the lateral axis, and wherein the third proof mass is located on the first side of the lateral axis, and the third proof mass crosses the transversal axis, and the center of gravity of the third proof mass lies at a nonzero first lateral distance from the transversal axis, and the third proof mass is suspended from the central anchor point by a first transversal, torsionally flexible suspension arrangement which extends along the transversal axis from the central anchor point to the third proof mass, and the fourth proof mass is located on the second side of the lateral axis, and the fourth proof mass crosses the transversal axis, and the center of gravity of the fourth proof mass lies at a nonzero second lateral distance from the transversal axis, and the fourth proof mass is suspended from the central anchor point by a second transversal, torsionally flexible suspension arrangement which extends along the transversal axis from the central anchor point to the fourth proof mass, wherein the accelerometer further comprises at least one first rotor sensing electrode on each of the third and fourth proof masses on the first side of the transversal axis, and at least one second rotor sensing electrode on each of the third and fourth proof masses on the second side of the transversal axis, wherein the accelerometer also comprises at least one fixed stator sensing electrode adjacent to each first rotor sensing electrode and at least one fixed stator sensing electrode adjacent to each second rotor sensing electrode, and wherein each torsionally flexible suspension arrangement comprises a stiff beam and a first torsion spring connected in series, so that one end of the stiff beam is attached to the central anchor point and the other end to the first torsion spring, and one end of the first torsion spring is attached to the stiff beam and the other to the corresponding proof mass.

2. A capacitive micromechanical accelerometer according to claim 1, wherein the first, second, third and fourth proof masses all have the same shape in the device plane, and the center of gravity of the first proof mass lies on the first side of the lateral axis, the center of gravity of the second proof mass lies on the second side of the lateral axis, the center of gravity of the third proof mass lies on the second side of the transversal axis, the center of gravity of the fourth proof mass lies on the first side of the transversal axis, and the first transversal distance, second transversal distance, first lateral distance and second lateral distance are all equal.

3. A capacitive micromechanical accelerometer according to claim 2, wherein a first end of the first proof mass lies on the first side of the lateral axis, and this first end of the first proof mass is coupled with a first vertically rigid coupling element to a first end of the third proof mass, which lies on the second side of the transversal axis, and a first end of the second proof mass lies on the second side of the lateral axis, and this first end of the second proof mass is coupled with a second vertically rigid coupling element to a first end of the fourth proof mass, which lies on the first side of the transversal axis.

4. A capacitive micromechanical accelerometer according to claim 3, wherein the first end of the third proof mass is coupled to the first end of the second proof mass with a third vertically rigid coupling element, and the first end of the fourth proof mass is coupled to the first end of the first proof mass with a fourth vertically rigid coupling element.

5. A capacitive micromechanical accelerometer according to claim 1, wherein the first, second, third and fourth proof masses each comprise a protrusion which extends parallel to the fixed beam of the corresponding torsionally flexible suspension arrangement, and that each torsionally flexible suspension arrangement further comprises a second torsion spring, wherein one end of the second torsion spring is attached to the fixed beam and the other to said protrusion.

* * * * *